Figure 1:
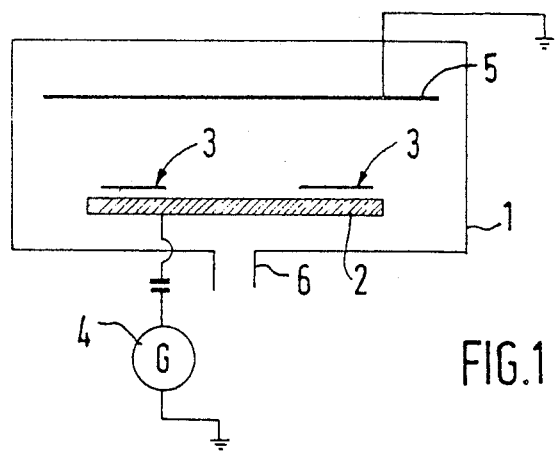

United States Patent [19]

Rufin et al.

[11] Patent Number: 4,872,944
[45] Date of Patent: Oct. 10, 1989

[54] PROCESS FOR THE CONTROL IN REAL TIME OF THE SELECTIVITY OF THE ETCHING BY ANALYSIS OF THE PLASMA GASES IN A PROCESS OF REACTIVE IONIC ETCHING AND A REACTOR THEREFORE

[75] Inventors: Denis Rufin, Hinsdale, Ill.; Ikuo Hirase, Ibaraki, Japan

[73] Assignee: L'Air Liquide, Societe Anonyme Pour l'Etude et l'Explanation des Procedes Georges Claude, Paris, France

[21] Appl. No.: 233,045

[22] Filed: Aug. 17, 1988

[30] Foreign Application Priority Data

Aug. 20, 1987 [FR] France ................. 87 11754

[51] Int. Cl.⁴ ............... H01L 21/306; B44C 1/22; C03C 15/00; C03C 25/06
[52] U.S. Cl. ................... 156/626; 156/643; 156/646; 156/657; 156/662; 156/345; 204/192.33; 204/192.37; 204/298
[58] Field of Search ............ 156/626, 627, 643, 646, 156/657, 662, 345; 204/192.33, 192.32, 192.35, 192.37, 298; 118/712, 728, 730, 50.1, 620; 427/38

[56] References Cited

U.S. PATENT DOCUMENTS 4,718,975 1/1988 Bowling .................. 156/643

OTHER PUBLICATIONS

IBM Technical Disclosure Bulletin, vol. 24, No. 1A, Jun. 1981, pp. 35-38, N.Y., U.S.; J. K. Hassan et al.
IBM Technical Disclosure Bulletin, vol. 20, No. 11A, Apr. 1978, pp. 4637-4638, Armonk, NY, U.S.; L. M. Ephrath.
Patent Abstracts of Japan, vol. 8, No. 232 (C-248) [1669], Oct. 25, 1984.

Primary Examiner—William A. Powell
Attorney, Agent, or Firm—Oblon, Spivak, McClelland, Maier & Neustadt

[57] ABSTRACT

The present invention concerns a process for the control in real time of the etching in a process for manufacturing electronic components of the type obtained by reacting ionic etching of wafers of silicon utilizing a plasma produced between two electrodes, wherein the gaseous species of the plasma are analyzed during the etching, at least one of the wafers of silicon being removable in situ from the influence of the plasma.

The invention also concerns a reactor therefore, comprising a housing under vacuum 31 including at least one support electrode 34 and one electrode 35 connected to ground between which a plasma is produced, means for producing a vacuum, means for loading and unloading wafers, means for introducing etching gas, wherein the reactor comprises at least two locations 40 for wafers 33, means for withdrawing at least one location from the influence of the plasma 37, said means and the locations being movable with respect to one another, and means for analyzing gaseous species of the plasma.

9 Claims, 4 Drawing Sheets

PROCESS FOR THE CONTROL IN REAL TIME OF THE SELECTIVITY OF THE ETCHING BY ANALYSIS OF THE PLASMA GASES IN A PROCESS OF REACTIVE IONIC ETCHING AND A REACTOR THEREFORE

DESCRIPTION

The present invention concerns a process for the control in absolute time of the selectivity of the etching in a reactive ionic etching by analysis of the gaseous species of the plasma, as well as a reactor therefore.

In the field of manufacture of electronic components, and more particularly in the field involving the treatment of silicon wafers by etching, it is important to control the uniformity of the etching.

Etching consists in removing, at certain locations only, the layer of silicon previously deposited on the silicon substrate (underlayer), the locations being defined by a mask of a resin deposited on the layer.

A first problem is the anisotropy of the etching which is resolved by selecting the technique of dry etching which ensures the perpendicularity of the sides of the holes etched with respect to the surface of the layers, while on the contrary, the so-called humid etching is isotropic and produces a lateral attack of the sides of the holes. This is the reason why the present invention is applicable to the field of dry etching, such as reactive ionic etching.

A second problem results from the fact that it is difficult to control the selectivity of the etching, i.e. the fact that only the layer should be removed, without reaching the underlayer.

The selectivity, and therefore in final instance the uniformity of the etching should be controlled to perfect the process of reactive ionic etching.

Etching consists in subjecting the silicon wafer to a plasma produced between two opposite electrodes, one being a support electrode (cathode) where the wafers to be etched are disposed. A plasma is produced and maintained between the electrodes, one being coupled to a power generator HF and the other one being connected to ground as will appear in the drawings.

The radicals and neutral species take part in chemical reactions at the surface exposed to the plasma, to produce volatile species or precursors. The positive ions are accelerated in the interelectrode field, impinge the surface of the wafers and start or complete the volatilization and accelerate the attack of the material to be removed at the locations which are left free by the mask.

The energy of the ions and of the reactive species can be increased by increasing the power (voltage) or by decreasing the pressure. These parameters have a direct influence on the speed of the etching.

To control the selectivity under various conditions in which the reactive ionic etching takes place, and to find the best conditions taking account the choice of the gases and the parameters defined by the etching devices (quality of vacuum, pressure, radiofrequency power, distance between the electrodes, composition of the electrodes . . . ) a known process consists in varying each of the parameters one by one and measuring the difference of thickness between the layers with a profilometer before and after the etching,. This method is exact and enables to known exactly the degree of etching of each material at any location of a sample.

However, this method using a profilometer is difficult because of the large number of parameters which must vary and the operations which are required for each measurement (introduction of the sample in the reactor, production of a vacuum, production of the plasma, etching, interruption of the plasma and discharge of the sample).

Moreover, in view of the difficulty of reproducing plasma atmosphere, it is difficult to compare between different tests which are inevitably separated in time by plasma interruptions.

This problem is solved according to the invention which proposes a process for the control in real time of the etching and which enables to carry the same without any time interruption of the plasma.

So, the present invention concerns a process for the control in real time of the etching in a process for manufacturing electronic components of the type obtained by reactive ionic etching of silicon wafers using a plasma produced between two electrodes, wherein the gaseous species of the plasma are analyzed during the etching, at least one of the silicon wafers being capable of being removed in situ from the influence of the plasma.

The gaseous atmosphere contains volatile products derived from the materials exposed to the plasma. These products are formed by the chemical reactions between the surface of the materials to be etched and certain reactive gaseous species present in the plasma under the essential action of the ionic impingement which activate these reactions.

An analysis of the gases produced directly represents the progress of the etching and enables, for example, to detect the end of the attack.

As a matter of fact, the quantity of volatile products obtained is directly proportional to the speed of etching of the material to be etched and to the surface of the wafer.

For example, for a wafer of 100 mm diameter and a speed of etching of 100 nm/mm, the proportions of $SiF_4$ in the gaseous atmosphere are of:

3.63% in the case of a wafer of Si 1.95% in the case of a wafer of $SiO_2$.

The present invention also concerns a reactor for the reactive ionic etching of silicon wafers of the type including a housing under vacuum comprising at least one support-electrode connected to a generator and an electrode connected to ground between which a plasma is produced, means for producing a vacuum, means for loading and unloading wafers, means for introducing an etching gas, characterized in that it comprises at least two wafer locations, means for withdrawing at least one location from the influence of the plasma, said means and the locations being movable with the respect to one another, and means for analyzing plasma gases.

Figures 2A, 2B:
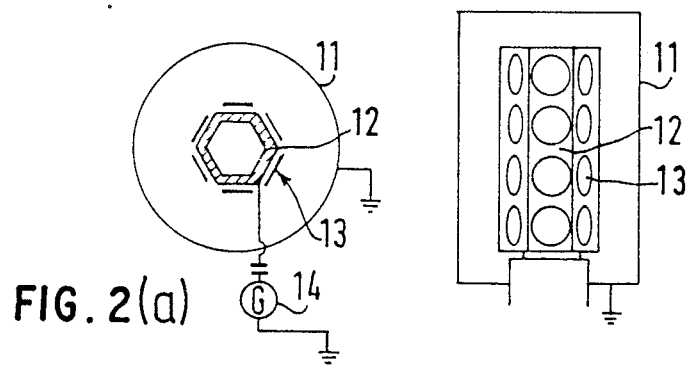
Figure 3:
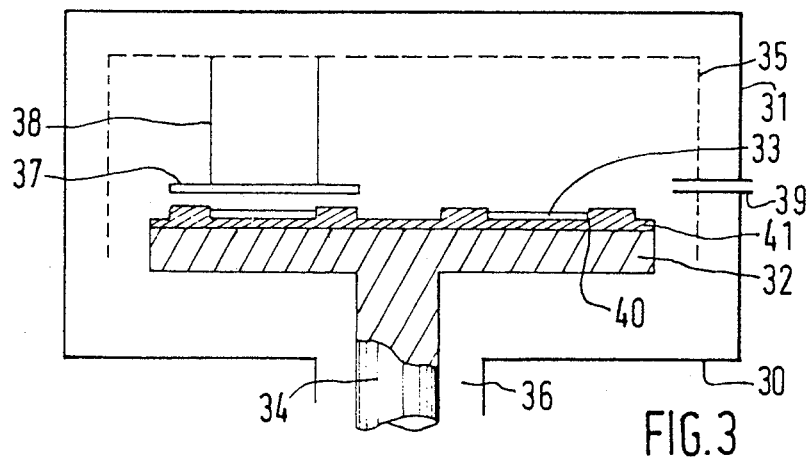
Figure 4:
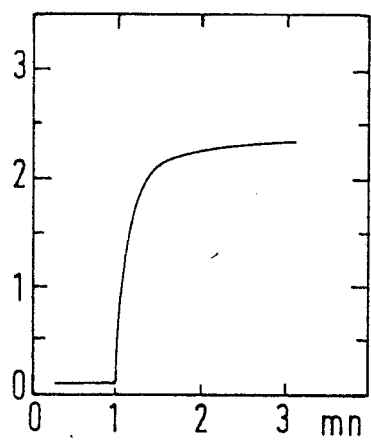

Other characteristics and advantages of the invention will appear from the examples which follow and with reference to the annexed drawings in which:

FIGS. 1, 2a and 2b are schematic representations in cross-section of known devices for reactive ionic etching, FIG. 3 is a schematic representation of a reactor according to the invention, FIGS. 4, 5, 6 and 7 represent results of analyses described in the examples.

On FIG. 1 there is shown a known reactor for reactive ionic etching. The housing 1 comprises a support-electrode 2 connected to a generator G 4. The silicon wafers 3 are disposed on the support-electrode 2, opposite electrode 5 connected to ground. By means of a pump the outlet 6 enables the exhaust the plasmic effluents and also to provide vacuum condition therein.

On FIGS. 2 a and b there is represented a so-called "hexode" variant of the reactor, which enables to treat a more important number of wafers 13 disposed on a support-electrode 12 of hexagonal cross-section and similarly connected to a generator G 14. On these figures, the housing 11 is represented as being connected to ground.

FIG. 3 is a cross-section representing an embodiment of a reactor according to the invention.

The usual means for loading and unloading as well as introducing etching gases are not illustrated.

A circular support electrode 32 is disposed in the cylindrical housing 31. The bottom 30 of the housing 31 is provided with a sleeve 36 through which a rod 34 extends, which rod supports the support-electrode 32. The rod 34 is connected to means for rotating the support-electrode 32 and to a frequency generator, neither being represented. Another electrode 35 defining a casing is kept opposite the support-electrode 32 by known means. The means for grounding the electrode 35 and the chamber are not represented. Sleeve 36 is moreover connected to means for providing vacuum in the housing 31, such as a pump (not represented). A plate 41 provided with circular cavities where the silicon wafers 33 are disposed, is disposed on the support-electrode 32.

A sampling tube 39 sealingly extends through the wall of the housing 31. The end of the tube 39 opens inside the housing and the electrode forming casing 35. The end of the tube 39 which is outside housing 31 is connected to means for analyzing sampled gaseous species of the plasma (not illustrated in the drawings).

The means of analyzing gases include any usual means capable of detecting these gaseous species, such as a spectrometer for analysis by quadripolar mass spectroscopy (QMS) or by optical emission spectroscopy (SEO).

A screen 37 of aluminum alloy (AG 3–5) is suspended 1 mm above the level of the silicon wafers 33, by means of stainless steel screws 38.

Any other conductive material, particularly one which is metallic and neutral towards plasma would be suitable. For example, Al is suitable in fluorocarbonated plasmas because the compound $AlF_3$ is not volatile. Any conductive Teflon ™ material would also be suitable.

Other means not represented consist in providing for example a reactor such as the one illustrated in FIGS. 2a and b with a screen withdrawing a wafer or a row of wafers from the plasma by means of a screen fixedly mounted in the housing. It would also be possible to provide as a variant a screen which can move within the housing opposite successive wafers, or a screen masking a plurality of wafers, or even a plurality of screens.

The means for introducing an etching gas are not illustrated. They usually consist of an opening for the controlled introduction of gas in the housing, the opening being connected to one of the sources of gas. However, the material of the support-electrode and/or of the plate carrying the electrodes can also, under the action of the plasma, release moecules which can take part in the attack reaction, as it is the case with Teflon ™ (polytetrafluoroethylene).

The reactor according to the invention operates as any reactor for the reactive ionic etching, notwithstanding the nature of the etched materials or the etching gases.

It is also known that the plasma which is formed comprises along its periphery a sheath of a thickness of the order of one millimeter. To be efficient, the screen should be placed above the wafer and below the external surface of the bottom of the sheath.

Other characteristics and advantages of the invention will appear from reading the following examples which show in the particular case of Si and $SiO_2$ etched with fluorocarbonated plasmas, how it is possible to find the optimum etching conditions.

EXAMPLE 1

In a reactor according to the invention, a single wafer location on the cathode is occupied by a wafer whose exposed surface comprises $SiO_2$ and the etching is carried out with a $CF_4$ plasma. The wafer remains under the screen for one minute, then it is rotated 180°. An analysis of the quantities of $SiF_4$ during etching (illustrated in FIG. 4, time in mn), reveals that a signal which is 22.5 times stronger (2.25/0.1) appears when the surface is exposed to the plasma. This enables to conclude that $SiF_4$ originates from the wafer when the latter is exposed.

EXAMPLE 2

Figure 5:
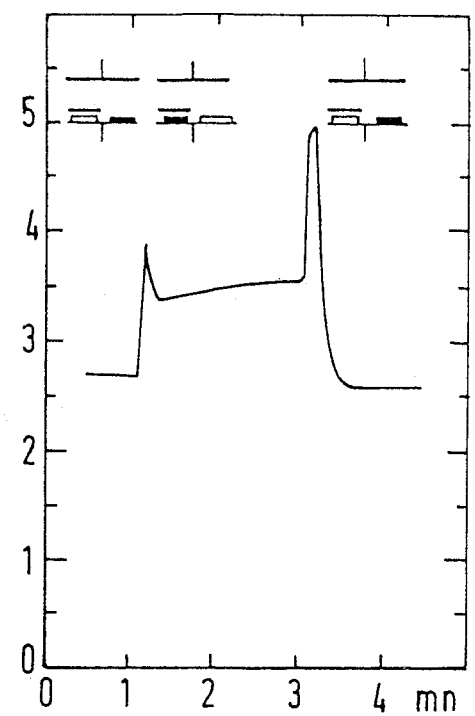

In a similar reactor, in which one location is occupied by a silicon wafer (black) and another one by a wafer whose exposed surface comprises $SiO_2$ (white, using a $C_3F_8$ plasma, the analysis of $SiF_4$ was carried out for different positions of the wafers with respect to the screen. The results are represented in FIG. 5. This analysis enables to allocate to each exposed material the quantity of $SiF_4$ released: in a first phase (first minute), only the silicon wafer is exposed, the wafer of $SiO_2$ being masked by the screen represented by a bar on the schematic illustration; $SiO_2$ is then exposed separately during the second and third minute, then again Si alone during the fourth minute. The first and the third plate is allocated to Si, and the second plate to $SiO_2$.

During the rotation, when none of the wafers is free from the action of the plasma, peaks are observed in the quantities of $SiF_4$ released.

EXAMPLE 3

Figure 6:
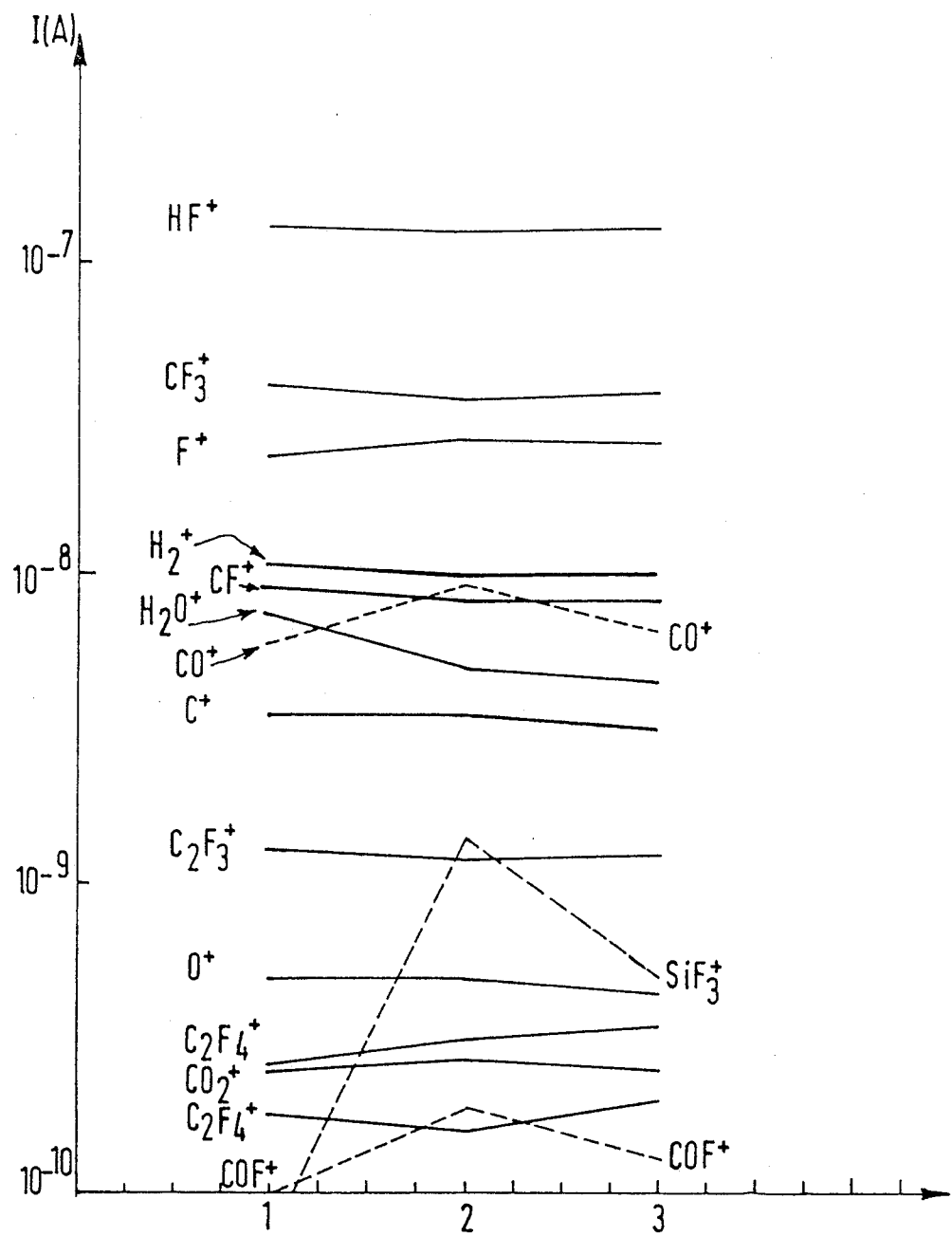

The QMS analysis of the different gaseous species present in a $CF_4$ plasma has been realized without interruption of the plasma and illustrated in FIG. 6 for different materials to be etched.
 1-no wafer (reference measurement)
 2-Si wafer under the screen, $SiO_2$ wafer exposed to the plasma
 3-$SiO_2$ wafer under the screen, Si wafer exposed to the plasma.

The $SiF_3^+$ ions, $CO^+$ and $COF^+$ are representatives of the $SiF_4$ species, (derived from Si and/or $SiO_2$) and CO, $COF_2$ and COF (derived from $SiO_2$). The ionic current (in A) is measured in ordinate. Other less significant ions have also been detected with the QMS analysis.

EXAMPLE 4

These analyses enable to determine the optimum conditions for the selectivity, by the study of the evolution of $SiF_4$ released, as a function of the gaseous composition by the screen method according to the invention.

Figure 7:
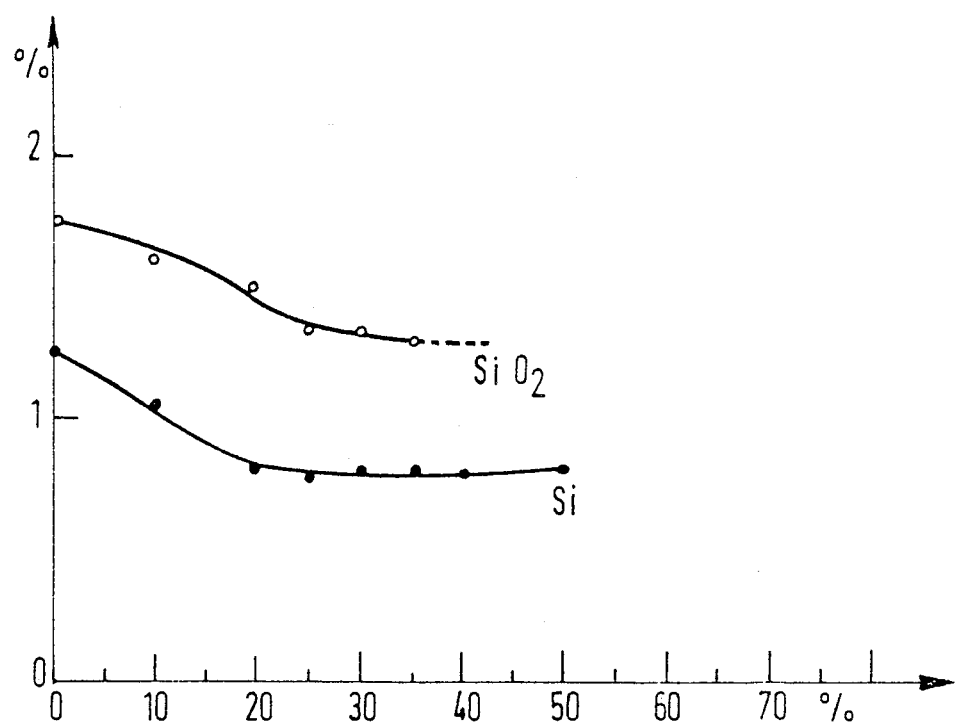

FIG. 7 represents the pourcentage of $SiF_4$ derived from $SiO_2$ (circles) and from Si (dots) present in the plasma $CH_4/C_2F_6$, as a function of the percentage of $CH_4$ in $C_2F_6$.

It would seem that the difference between the curves is more important in the vicinity of 20% $CH_4$ in $C_2F_6$; the optimum mixture is the one for which the ratio of the relative $SiF_4$ releases is higher.

In the same manner, it has been possible to determine that 70% $H_2$ in $C_3F_8$, 40% $H_2$ in $CF_4$ and 20% $CH_4$ in $CF_4$ promote a good selectivity.

EXAMPLE 5

This process also enables to determine that the attack of a layer of $SiO_2$ on Si is terminated when the spectroscopic analysis (SEO for CO, or QMS for CO or $SiF_4$) reveals a decrease of the amount of products derived from decomposition of $SiO_2$. The process according to the invention therefore enables to detect the end of the attack.

We claim:

1. Process for the control in real time of etching in a process of manufacturing electronic components obtained by reactive ionic etching of silicon wafers utilizing a plasma produced between two electrodes, wherein the gaseous species of the plasma are analyzed during the etching, at least one of the silicon wafers being withdrawable in situ from the influence of the plasma.

2. Process according to claim 1, whrein said wafer is withdrawn from the influence of the plasma by placing a screen between the two electrodes.

3. Process according to claim 2, wherein the screen and the wafers are movable with respect to one another.

4. Reactor for the reactive ionic etching of silicon wafers, said reactor including a vacuum housing comprising a support-electrode (34) connected to a generator and an electrode (35) connected to ground between which a plasma is produced, vacuum means, means for loading and unloading wafers, means for introducing etching gas, wherein said reactor comprises at least two locations (40) for wafer (33), means for withdrawing at least one location from the influence of the plasma (37), said means and said locations being movable with respect to one another, and means for analyzing gaseous species of the plasma.

5. Reactor according to claim 4, wherein said withdrawing means comprise at least one screen.

6. Reactor according to claim 4 or 5, wherein the screen is made of aluminum alloy.

7. Reactor according to claim 4 or 5 to wherein the screen is 1 mm from the wafers.

8. Reactor according to claim 4 or 5 to which comprises means for moving the support-electrode, such as by rotation.

9. Reactor according to claim 4 or 5 to which comprises means for moving the screen.

* * * * *

UNITED STATES PATENT AND TRADEMARK OFFICE
CERTIFICATE OF CORRECTION

PATENT NO. : 4,872,944

DATED : Oct. 10, 1989

INVENTOR(S) : Denis Rufin, et al

It is certified that error appears in the above-identified patent and that said Letters Patent is hereby corrected as shown below:

The Assignee is incorrectly recorded, " L'Air Liquide, Societe Anonyme Pour l'Etude et l'Explanation des Procedes Georges Claude" should be:

--L'Air Liquide, Societe Anonyme Pour L'Etude et
  L'Exploitation des Procedes Georges Claude--

Signed and Sealed this

Thirteenth Day of November, 1990

Attest:

HARRY F. MANBECK, JR.

*Attesting Officer*     *Commissioner of Patents and Trademarks*